(12) United States Patent
Barwicz et al.

(10) Patent No.: US 9,716,367 B2
(45) Date of Patent: Jul. 25, 2017

(54) SEMICONDUCTOR OPTOELECTRONICS AND CMOS ON SAPPHIRE SUBSTRATE

(71) Applicant: International Business Machines Corporation, Armonk, NY (US)

(72) Inventors: Tymon Barwicz, Yorktown Heights, NY (US); Effendi Leobandung, Stormville, NY (US); Ning Li, White Plains, NY (US); Jean-Olivier Plouchart, New York, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/974,268

(22) Filed: Dec. 18, 2015

(65) Prior Publication Data

US 2017/0179681 A1    Jun. 22, 2017

(51) Int. Cl.
  *H01S 5/02*   (2006.01)
  *H01L 27/092*  (2006.01)
  *H01L 21/8238* (2006.01)
  *H01S 5/30*   (2006.01)

(52) U.S. Cl.
  CPC ........ *H01S 5/0213* (2013.01); *H01L 21/8238* (2013.01); *H01L 27/092* (2013.01); *H01S 5/3013* (2013.01); *H01S 2304/00* (2013.01)

(58) Field of Classification Search
  CPC .. H01S 5/0213; H01S 5/3013; H01S 2304/00; H01L 27/092; H01L 21/8238
  See application file for complete search history.

(56) References Cited

U.S. PATENT DOCUMENTS

| | | | |
|---|---|---|---|
| 6,388,275 B1* | 5/2002 | Kano .................... | B82Y 20/00 257/11 |
| 6,583,445 B1* | 6/2003 | Reedy .................. | H01L 31/101 257/80 |
| 8,508,008 B2* | 8/2013 | Griebenow ........ | G02B 6/12004 257/431 |
| 2003/0160231 A1* | 8/2003 | Cole ........................ | G01J 3/26 257/22 |

* cited by examiner

*Primary Examiner* — Xinning Niu
(74) *Attorney, Agent, or Firm* — Cantor Colburn LLP; Louis Percello (57) ABSTRACT

The present disclosure relates to nitride based optoelectronic and electronic devices with Si CMOS. The disclosure provides a semiconductor device, comprising a sapphire substrate, and a laser region and a detector region deposed on the sapphire substrate. The laser is formed onto the substrate from layers of GaN, InGaN and optionally the AlGaN. The detector can be an InGaN detector. A waveguide may be interposed between the laser and detector regions coupling these regions. The semiconductor device allows integration of nitride base optoelectronic and electronic devices with Si CMOS. The disclosure also provides a method for making the semiconductor devices.

11 Claims, 12 Drawing Sheets

SEMICONDUCTOR OPTOELECTRONICS AND CMOS ON SAPPHIRE SUBSTRATE

BACKGROUND

The present disclosure relates to nitride based optoelectronic and electronic devices with silicon complementary metal oxide semiconductor (Si CMOS).

A CMOS device is a transistor device used for amplifying or switching electronic signals. The CMOS device has a source, a drain, and a metal oxide gate electrode. The metal gate is electrically insulated from the main semiconductor n-channel or p-channel by a thin layer of insulating material, for example, silicon dioxide or glass, which makes the input resistance of the CMOS device relatively high. The gate voltage controls whether the path from drain to source is an open circuit ("off") or a resistive path ("on").

N-type field effect transistors (nFET) and p-type field effect transistors (nFET) are two types of complementary metal oxide semiconductors. The nFET uses electrons as the current carriers and with n-doped source and drain junctions. The pFET uses holes as the current carriers and with p-doped source and drain junctions.

The integration of nitride based optoelectronics and electronic devices with silicon CMOS devices can enable high performance optical interconnects and other applications. Previously silicon CMOS devices and III-V optoelectronics devices, especially light source optoelectronics, have not been successfully integrated on one chip monolithically due to lack of a substrate that could provide high quality material for both electronic and optoelectronic devices.

SUMMARY

The disclosure provides nitride based optoelectronics and electronic devices on sapphire substrates integrated with silicon CMOS devices and methods for making such devices.

According to an embodiment of the invention, the disclosure provides a semiconductor device, comprising: sapphire substrate; a laser region and a detector region deposed on the substrate; wherein the laser region comprises InGaN, GaN, and optionally AlGaN.

According to another embodiment of the invention, the disclosure provides a semiconductor device, comprising: a sapphire substrate; a laser region and a detector region deposed on the substrate; wherein the laser region comprises a buffer deposed on the sapphire substrate, a first cladding layer comprising AlGaN deposed on the buffer, a GaN waveguide core deposed on the first cladding layer, and a second cladding layer comprising AlGaN deposed on the GaN waveguide core.

The disclosure also provides a method for making the nitride based semiconductor devices on a sapphire substrate. In yet another embodiment of the present invention, a method comprises deposing a laser region onto a sapphire substrate, wherein the laser region is formed by deposing a buffer layer onto the sapphire substrate; deposing a first cladding layer comprising GaN, AlGaN, or both onto the buffer layer; deposing a layer comprising a InGaN quantum well on the first cladding layer; deposing a second cladding layer onto the layer comprising the InGaN quantum well; and deposing a detector region onto the sapphire substrate.

BRIEF DESCRIPTION OF THE DRAWINGS

The subject matter which is regarded as the invention is particularly pointed out and distinctly claimed in the claims

2 at the conclusion of the specification. The forgoing and other features, and advantages of the invention are apparent from the following detailed description taken in conjunction with the accompanying drawings in which:

FIGS. 1-12 illustrate a method of making the Si CMOS monolithically integrated on a sapphire substrate, in which:

DETAILED DESCRIPTION

Turning now to the Figures, FIGS. 1-12 illustrate a Si CMOS monolithically integrated on a sapphire substrate and method of making such semiconductor devices according to various embodiments.

Figure 1:
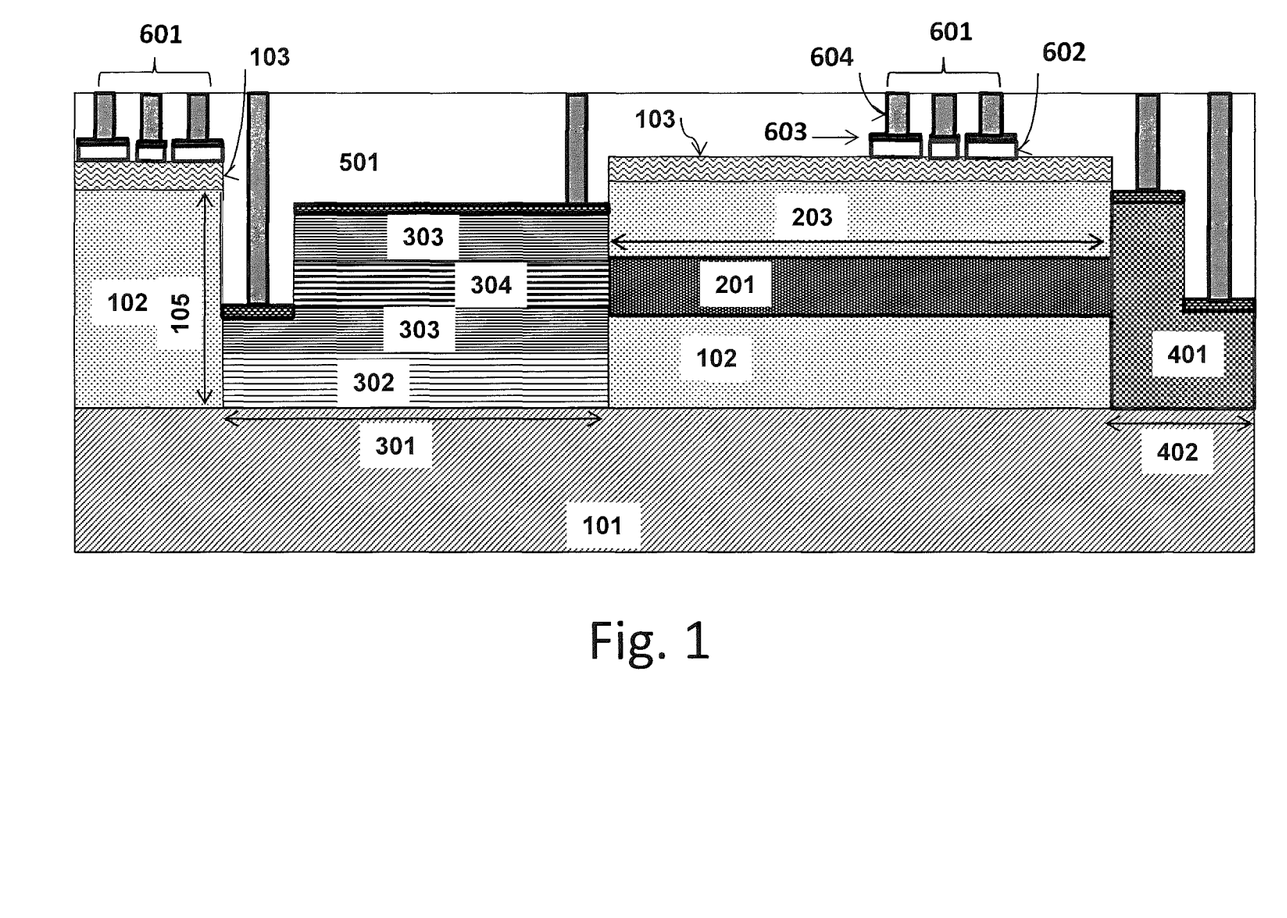
FIG. 1 is a cross-sectional side view of the complete semiconductor chip showing optoelectronics and Si CMOS with the GaN/InGaN laser and InGaN detector.

FIG. 1 is a cross-sectional side view of the complete semiconductor chip showing optoelectronics and Si CMOS with the GaN/InGaN laser and InGaN detector. The semiconductor chip includes a sapphire substrate (101) onto which a $SiO_2$ layer (102) containing a waveguide (201) is disposed. The $SiO_2$ layer is has a thickness (105) of approximately 2 μM. The chip includes a laser region (301), approximately 200 μm wide, deposed on the sapphire substrate and located at one end of the waveguide. In this embodiment the laser comprises a buffer (302), gallium nitride (GaN) or aluminum gallium nitride (AlGaN) cladding (303), and a quantum well (304), such as a indium gallium nitride (InGaN) quantum well. The chip also includes indium gallium detectors (401). The InGaN detectors have a width of approximately 50 μm and a thickness of approximately 2 μm. An additional Si layer (103) is applied over the $SiO_2$ layer (102). The Si layer is added by wafer bonding and smart cut. The Si CMOS (602) are fabricated onto the Si layer to form part of the Si FET (602).

The thickness of the sapphire substrate 101 generally varies and is not intended to be limited. In one aspect, the thickness of the substrate 101 is in a range from about 50 micrometers to about 2000 micrometers.

The thickness of $SiO_2$ layer 102 generally varies and is not intended to be limited. In one aspect, the thickness of the $SiO_2$ layer 102 is in a range from about 100 nm to about 2 µM.

Figure 2:
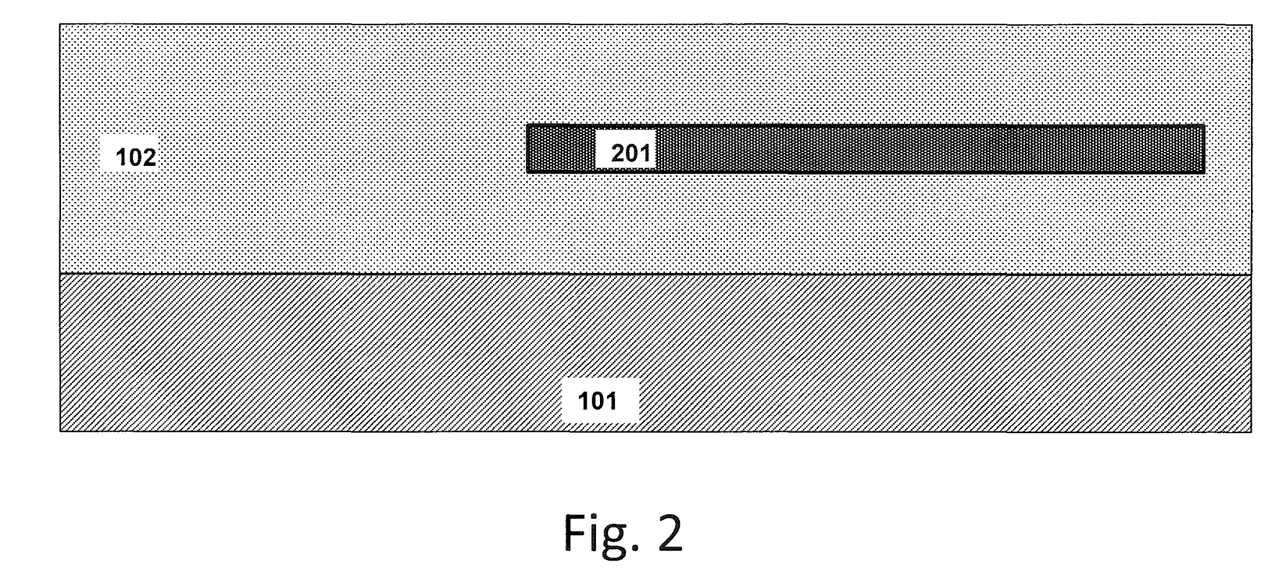
FIG. 2 is a cross-sectional side view of the starting material for fabricating the semiconductor chip showing a $SiO_2$ layer containing a SiN waveguide disposed on the sapphire substrate.

FIG. 2 is a cross-sectional side view of the starting material for fabricating the semiconductor chip showing a $SiO_2$ layer containing a SiN waveguide disposed on the sapphire substrate. The $SiO_2$ layer (102) is deposed on the sapphire substrate (101). The $SiO_2$ layer (102) contains a waveguide (201) having a width (203) of approximately 200 µm. The waveguide may be a SiN waveguide, or in some embodiments a SiON, or a GaN/AlGaN waveguide. The wave guide (201) may be formed by, for example, example, depositing a layer of $SiO_2$ and then depositing a layer of SiN on the layer of $SiO_2$ the layer of SiN may be patterned to form the waveguide (201). After the waveguide (201) is patterned, a second layer of $SiO_2$ may be deposited and planarized, using, for example, a chemical mechanical polishing process.

Figure 3:
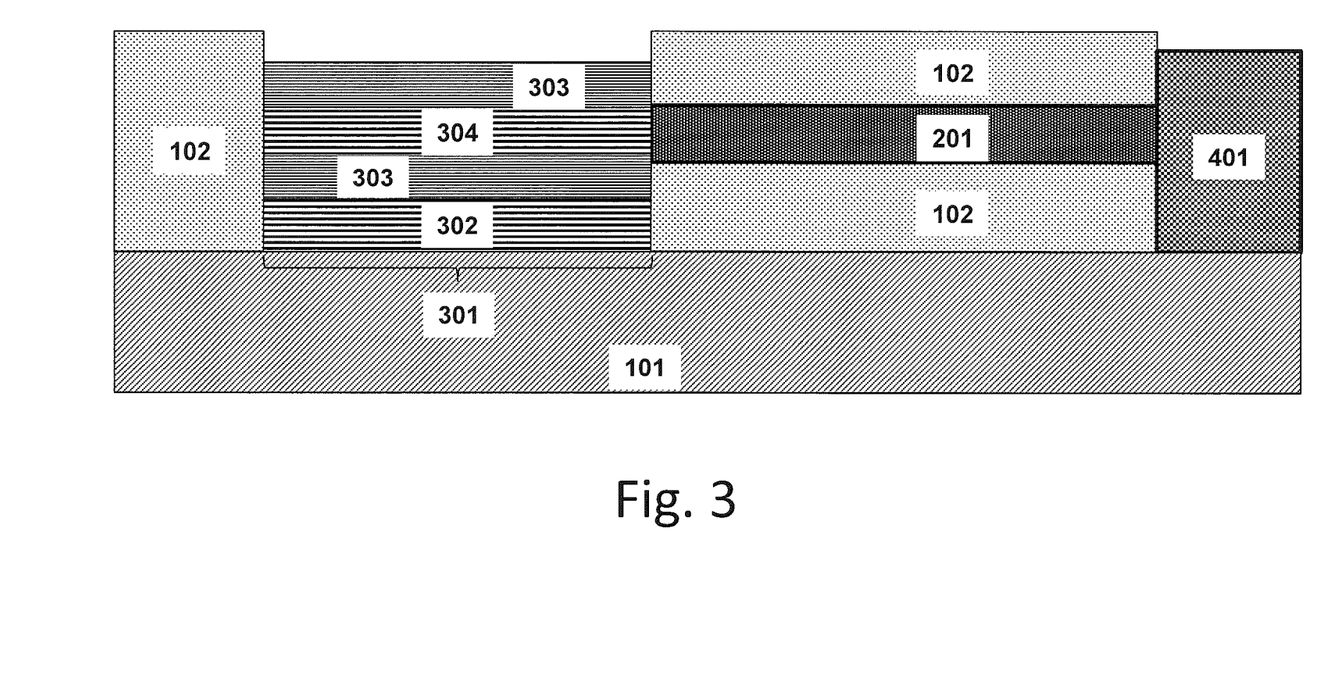
FIG. 3 is a cross-sectional side view after recessing the two $SiO_2$ regions and growing the GaN/InGaN laser and InGaN detector regions.

FIG. 3 is a cross-sectional side view of the chip after recessing the two $SiO_2$ regions and depositing the GaN/InGaN laser and InGaN detector regions. In the laser region (301) the buffer layer (302), comprising GaN, is deposited and starts growth of the laser region. Deposition of the buffer (302) is followed by deposition of a first cladding layer (303), which can be GaN or AlGaN, followed by deposition of the quantum well layer (304), which can be InGaN, followed by deposition of a second cladding layer (303) of the same material as the first cladding layer. The detector region (401) is grown by a similar process can be InGaN.

The laser (301) and detector (401) regions are recessed in the $SiO_2$ layer (102) to the depth of the sapphire substrate by disposing a mask (not shown) over the substrate and the $SiO_2$ layer on either side of the laser region (301) and etching the respective exposed $SiO_2$ that is uncovered by the mask. For example, a mask may be disposed over the $SiO_2$ layer, substrate, and laser region (301), followed by etching of the detector region (401). The mask is removed, and another mask is applied over the $SiO_2$ on either side of the laser region, substrate and detector region, followed by etching of the laser region (301). In another example, a mask is first disposed over the $SiO_2$ layer, substrate, and detector region (401), followed by etching the laser region (301). The mask is removed, and the un-etched $SiO_2$ (102) laser region (301), and substrate (101) are covered by another mask (not shown) and the detector region (401) is then etched.

The mask may be any suitable resist. Suitable resists include photoresists, electron-beam resists, ion-beam resists, X-ray resists, and etchant resists. The resist may a polymeric spin on material or a polymeric material. The mask may be removed by, for example, an ashing process.

The etching process employed to recess the $SiO_2$ layer (102) may be any suitable reactive ion etching (ME) process. Non-limiting examples of suitable etching processes include silicon etching methods selective to oxides.

The chips are loaded into the growth furnace together with the laser or detector material, such as GaN or InGaN. Windows are opened onto the chip and the laser (301) and detector (401) are grown layer by layer. The GaN/InGaN is deposited at approximately 1200° C.

An epitaxial growth process is used to form the laser layers, (302 through 304) and detector layer (401) specifically over the sapphire substrate. The epitaxial growth process is performed to grow a crystalline buffer layer (302) of e.g., GaN, onto the sapphire substrate (101) beneath. The underlying sapphire substrate (101) acts as a seed crystal. Epitaxial layers 301 may be grown from gaseous or liquid precursors.

The epitaxial layers 301 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Figure 4:
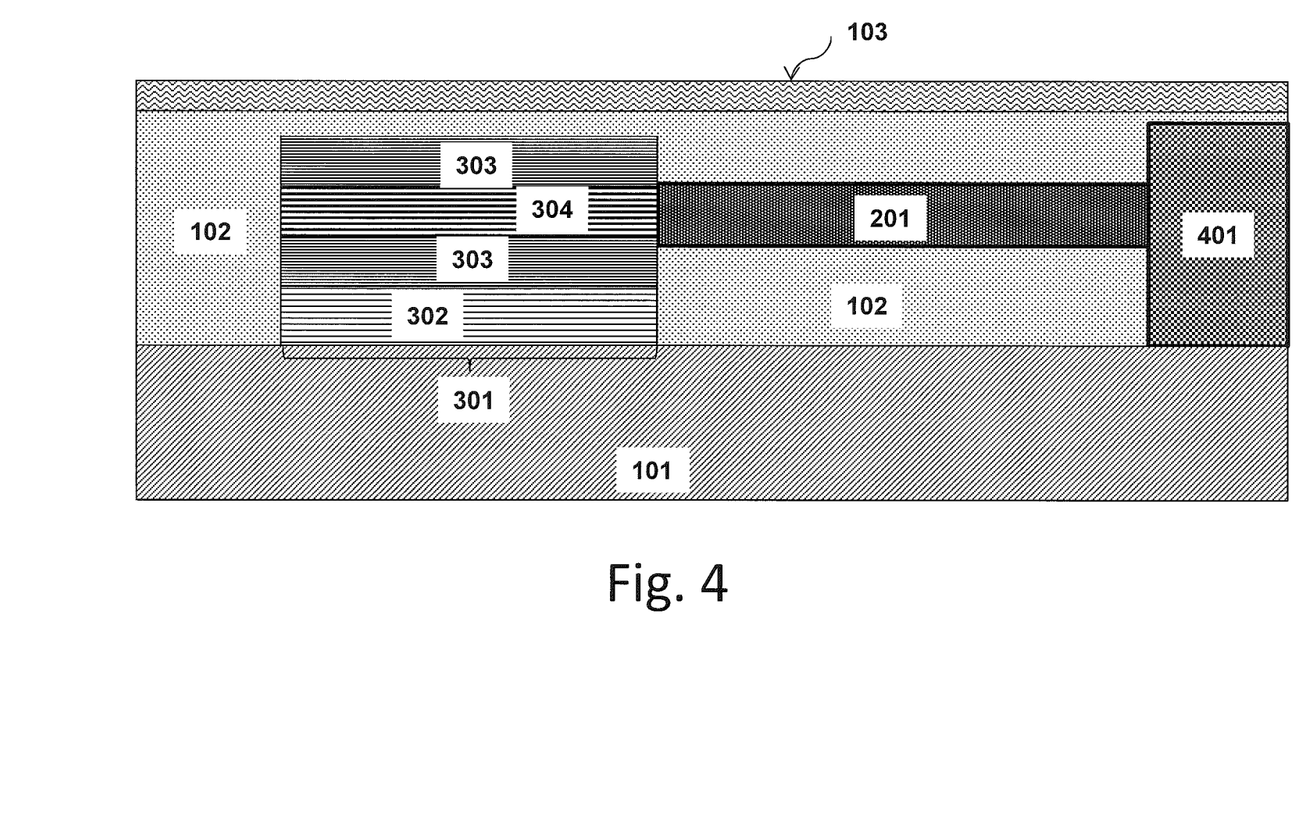
FIG. 4 is a cross-sectional side view after depositing additional $SiO_2$, CMP, and bonding a thin Si layer onto the $SiO_2$.

FIG. 4 is a cross-sectional side view after depositing additional $SiO_2$, planarization, and bonding a thin Si layer (103) onto the $SiO_2$. The planarizing process may include, for example, a chemical mechanical planarization (CMP) process.

Figure 5:
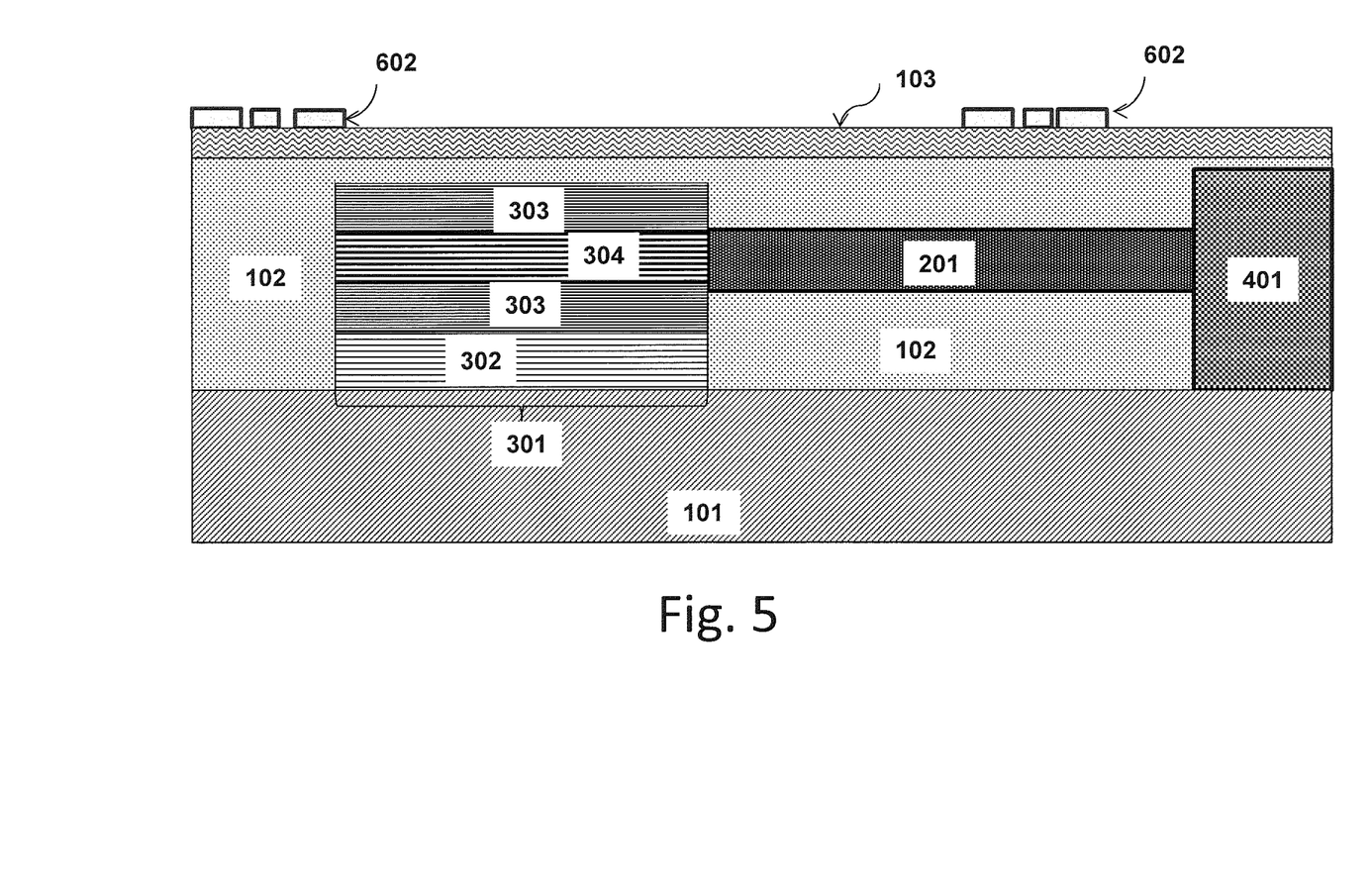
FIG. 5 is a cross-sectional side view after fabricating the silicon CMOS onto the thin silicon layer.

FIG. 5 is a cross-sectional side view after fabricating the silicon CMOS (602) onto the thin silicon layer (103). The Si CMOS may be fabricated with metal contacts (603 in FIG. 1). The Si CMOS (602) is fabricated at a lower temperature than the GaN, InGaN, or AlGaN laser and detector structures. The Si CMOS may be fabricated at approximately 1000° C.

Optical interconnectors (604 in FIG. 1) are then added onto the Si CMOS.

Figure 6:
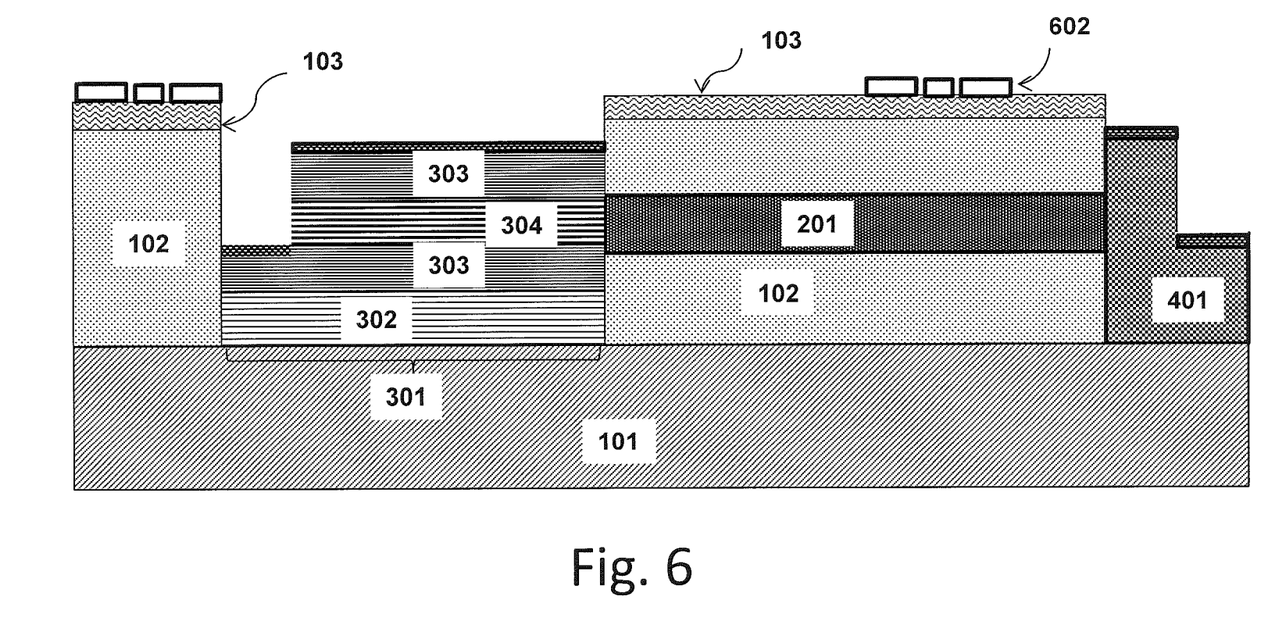
FIG. 6 is a cross-sectional side view after recessing a laser and a detector region to make contact to the optoelectronic devices.

FIG. 6 is a cross-sectional side view after recessing the laser (301) and detector (401) regions to make contact to the optoelectronic devices. The $SiO_2$ layers may be formed by the masking and etching processes described previously.

Figure 7:
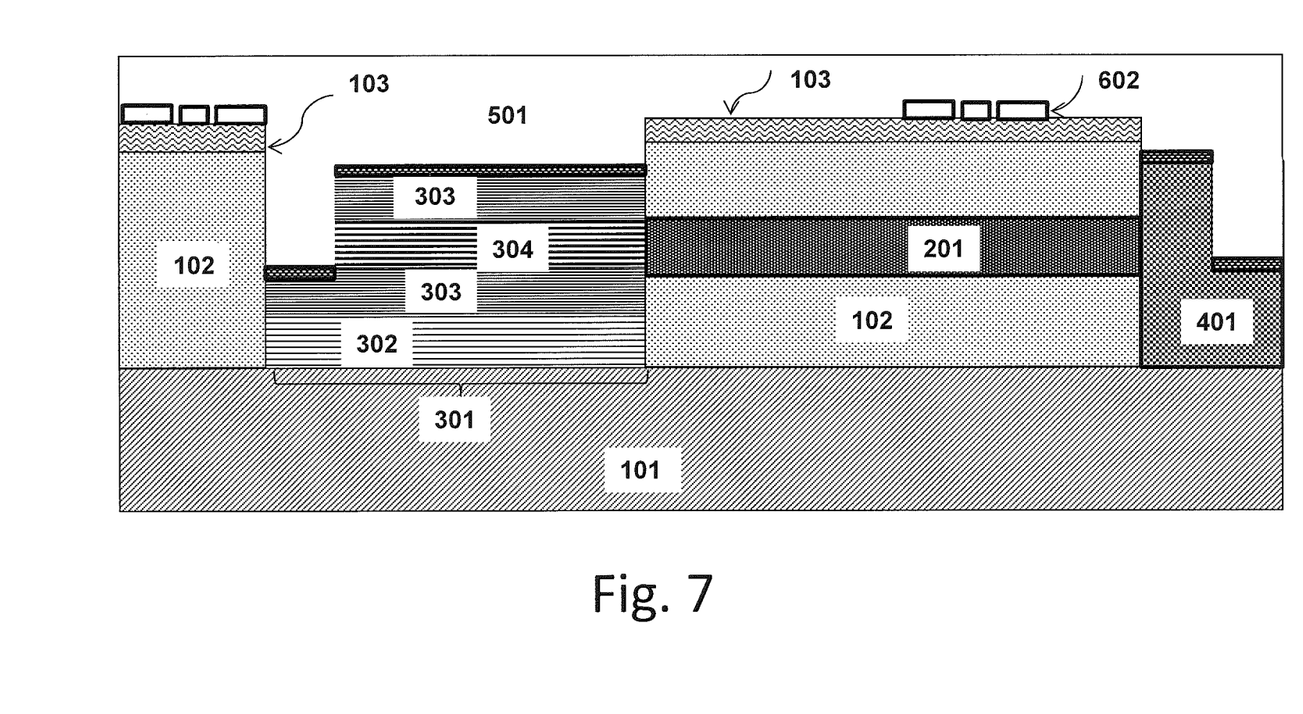
FIG. 7 is a cross-section side view after deposition of an insulating layer (hard mask layer) over the laser and detector regions and planarization.

FIG. 7 is a cross-section side view after deposition of an insulating layer (501) (hard mask layer) over the laser (301) and detector regions (401) and planarization. The insulating layer (501) prevents oxidation of the laser (301) and detector layers (401) by forming a capping layer. The insulating layer (501) also maintains the shape of the surface of the laser (301) and detector (401) layers by preventing surface rearrangement. The insulating layer should be thick enough to prevent oxygen from penetrating through to the laser and detector layers 401.

The insulating layer 501 includes a suitable insulating or hard mask material. Non-limiting examples of suitable materials for the insulating layer 501 include silicon nitride, silicon oxide, silicon dioxide, aluminum oxide, or a combination thereof. The insulating layer 501 may be formed using a suitable deposition process, including, but not limited to CVD, PVD, plasma enhanced CVD, atomic layer deposition (ALD), evaporation, chemical solution deposition, or like processes.

The thickness of the insulating layer 501 may generally vary and is not intended to be limited. In some embodiments, the thickness of the insulating layer 501 is in a range from about 20 to about 200 nm. In other embodiments, the thickness of the insulating layer 501 is in a range from about 50 to about 100 nm.

Figure 8:
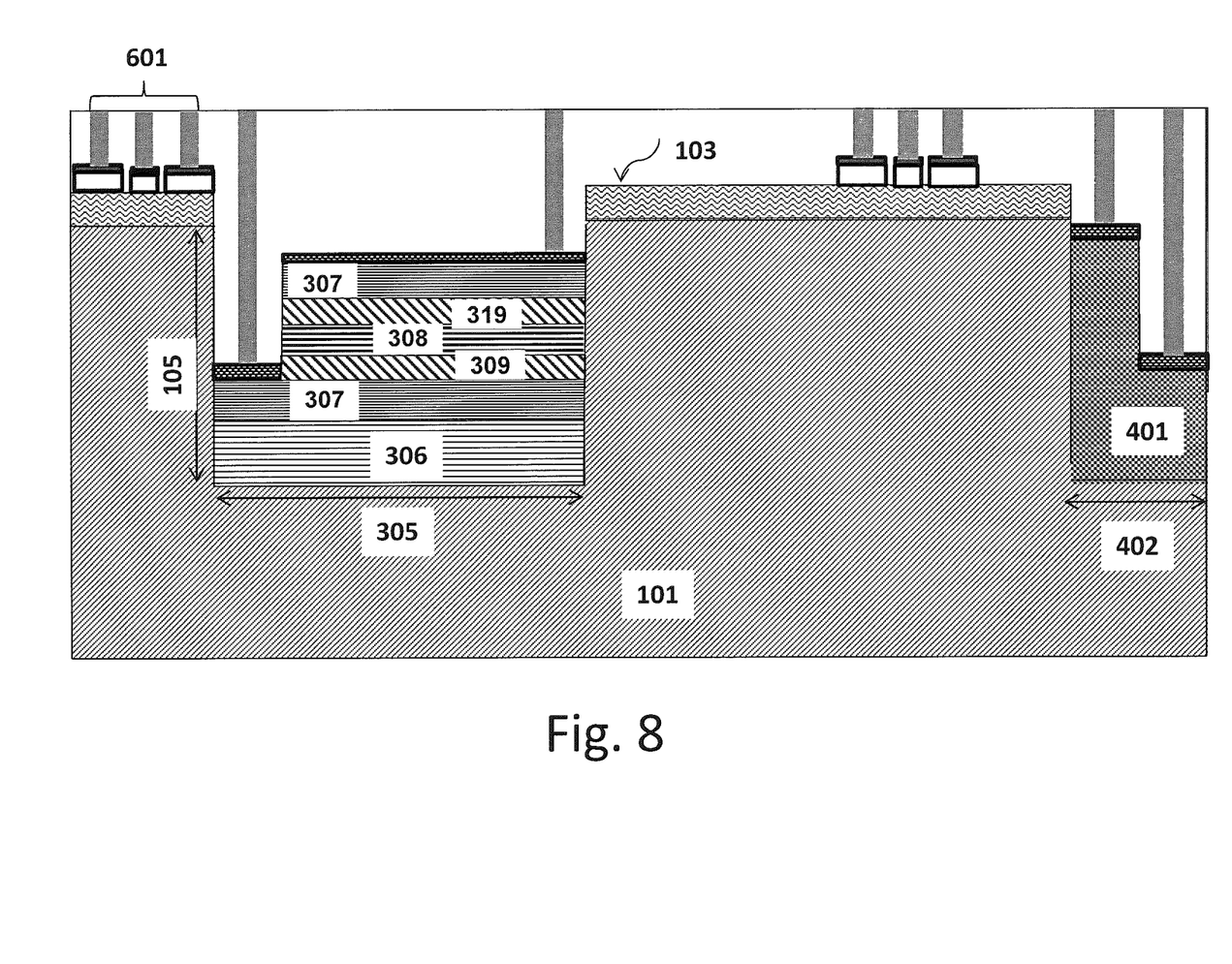
FIG. 8 is a cross-sectional side view of an embodiment in which the InGaN laser structure contains an GaN waveguide core layer and an AlGaN cladding layer.

FIG. 8 is a cross-sectional side view of an embodiment in which the laser structure (305) is an InGaN/AlGaN laser structure. The laser structure contains a buffer layer (306), onto which is deposed a first AlGaN cladding layer (307) followed by a GaN waveguide core layer (309, 319) having an n-GaN core layer and a p-GaN core layer, and a second AlGaN cladding layer (307). The GaN waveguide core layer contains a InGaN quantum well (308). The thickness of each AlGaN cladding layer (307) is approximately 500 nm. The thickness of each the n-GaN waveguide core (309) below the InGaN quantum well (308) is approximately 100 nm and the thickness of the p-GaN waveguide core (319) above the InGaN quantum well (308) is also approximately 100 nm. This embodiment also includes an InGaN detector region (410).

The InGaN laser structure with the GaN waveguide core layer (309, 319) and AlGaN waveguide cladding layers (307) of this embodiment provides improved light confinement.

Figure 9:
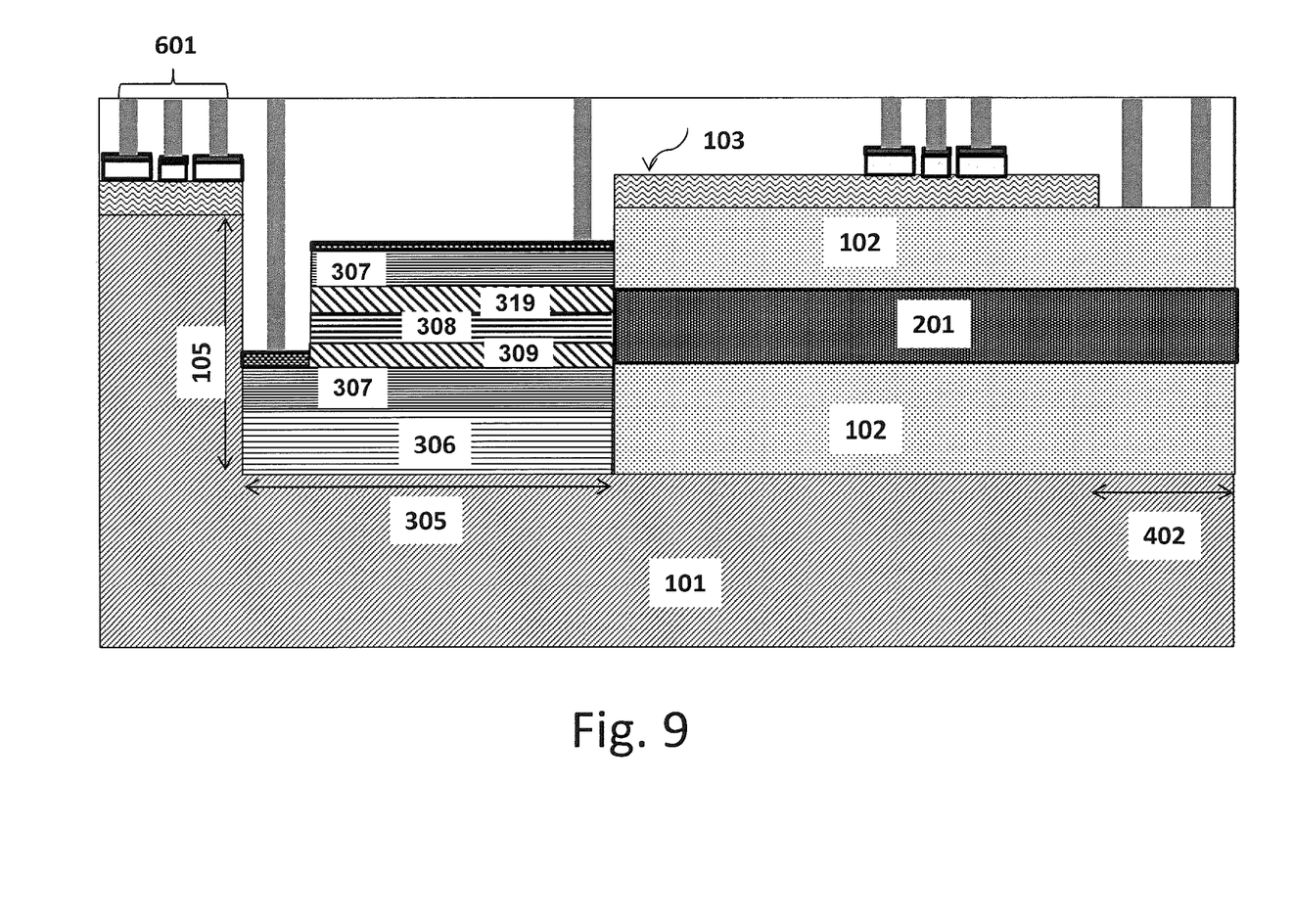
FIG. 9 is a cross-sectional side view of an embodiment in which the InGaN laser structure is coupled to a SiON waveguide.

FIG. 9 is a cross-sectional side view of an embodiment in which the InGaN laser structure (305) is coupled to a SiON waveguide (201). The SiON waveguide (201) provides lower optical transmission (lower light loss) and a shorter wavelength cutoff as compared to other waveguide materials. The SiON/$SiO_2$ waveguide ((201) and the surrounding $SiO_2$ layers (102)) has a smaller refractive index and provides for improved coupling to the InGaN/AlGaN laser (305) which also has a small refractive index. The comparable refractive indices of the SiON/$SiO_2$ waveguide (201/102) and InGaN/AlGaN laser (305) provide for improved coupling of the laser and waveguide. GaN of the waveguide core also has a lower optical index contrast with the AlGaN cladding.

Figure 10:
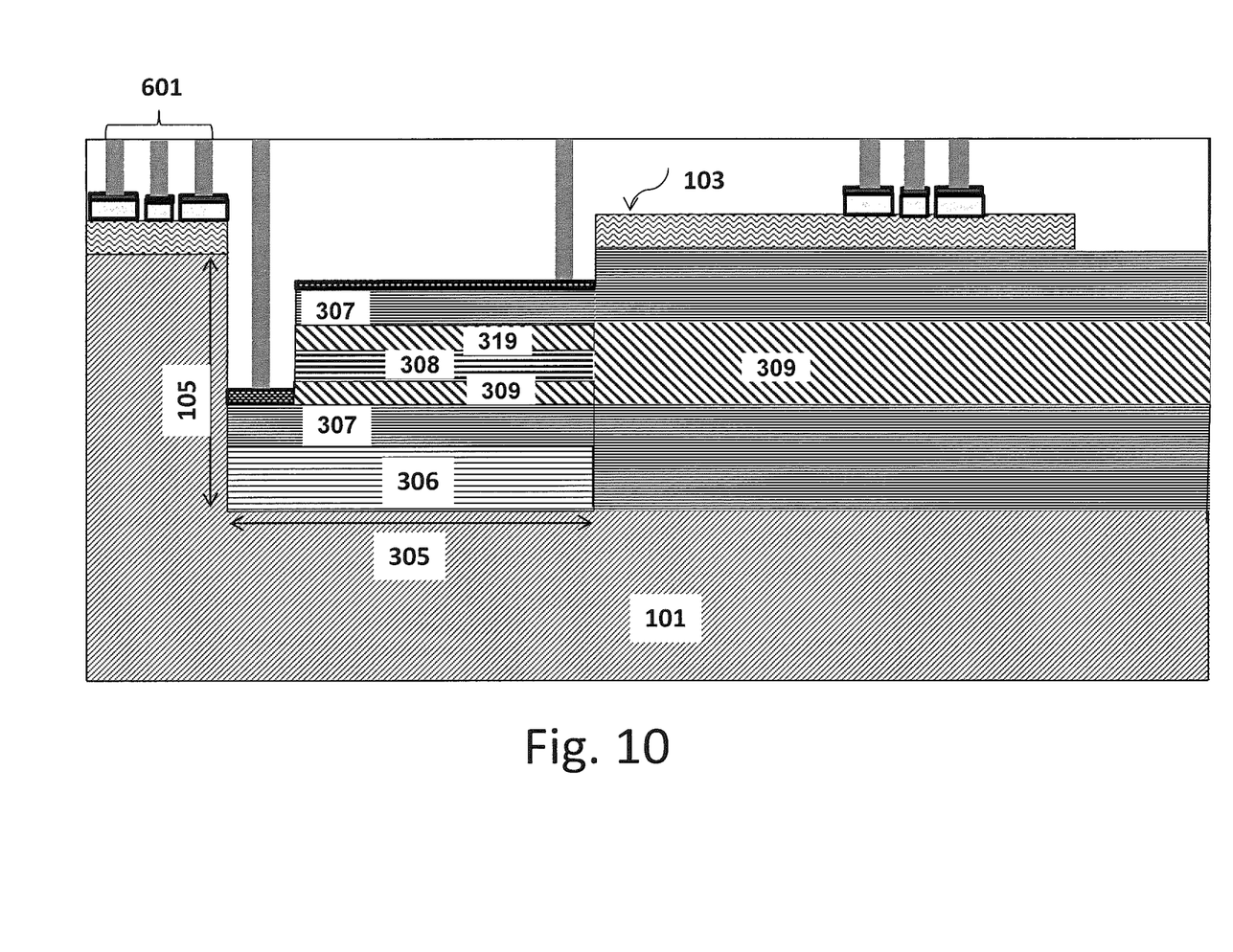
FIG. 10 is a cross-sectional view of a an embodiment in which a GaN waveguide with AlGaN cladding is used.

FIG. 10 is a cross-sectional view of an embodiment in which a GaN waveguide (309, 308, 319) with AlGaN cladding (307). The GaN waveguide with AlGaN cladding (307) has the best refractive index match with the InGaN/AlGaN laser (305) for optimal coupling of the laser and waveguide.

Figure 11:
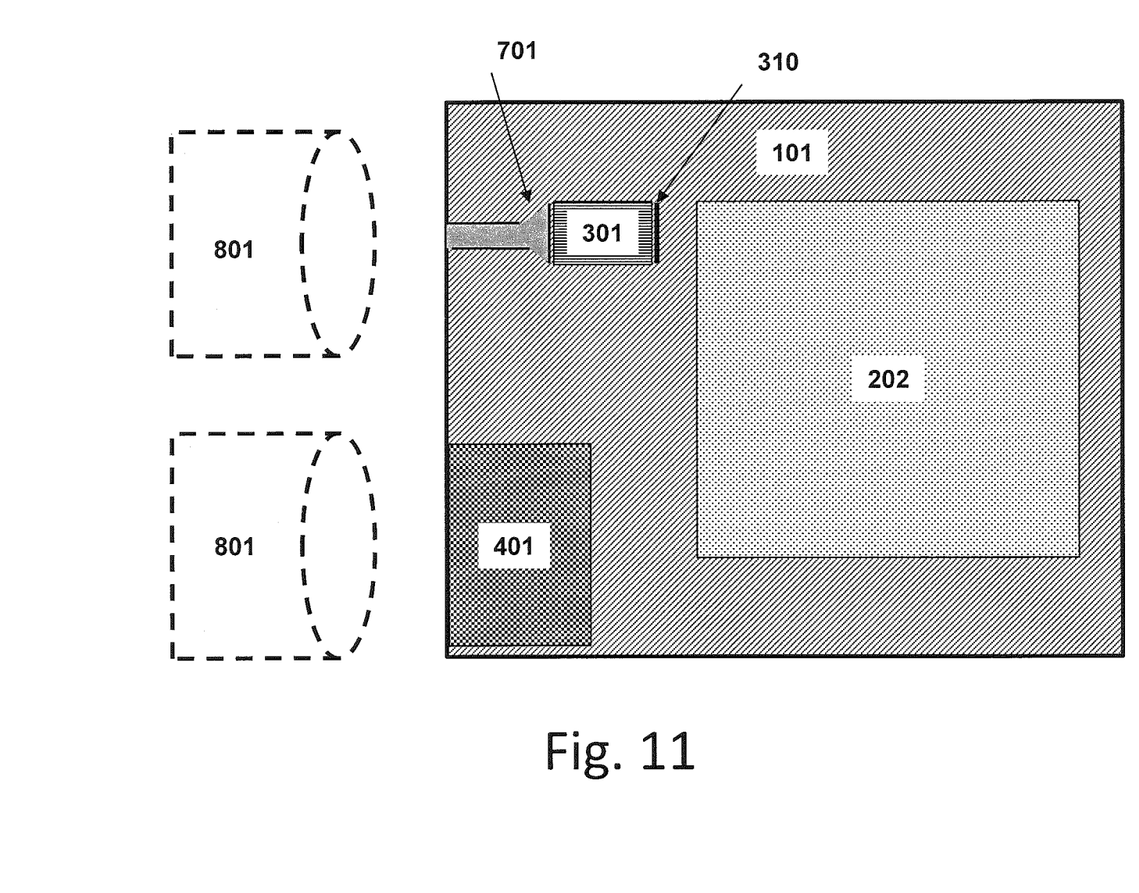
FIG. 11 is a top view of the chip showing coupling of the laser and detector to optical fibers. A spot size converter is used to couple fiber to laser in this embodiment.

FIG. 11 is a top view of the chip showing coupling of the laser (301) and detector (401) to optical fibers (801). A spot size converter (701) is used to couple fiber to laser in this embodiment. A reflective mirror (310) made of dielectric material may be placed at the end of the laser opposite the spot size convertor (701). In an alternate embodiment the laser (301) is placed at the edge of the chip like the detector (401) for direct coupling to the optical fiber. In another embodiment the laser is coupled to the optical fiber via a regular mode size convertor. The optical fibers (801) transmit light having a 450 nm wavelength. The optical fiber mode field diameter is 2.5 to 5.0 micrometers.

Figure 12:
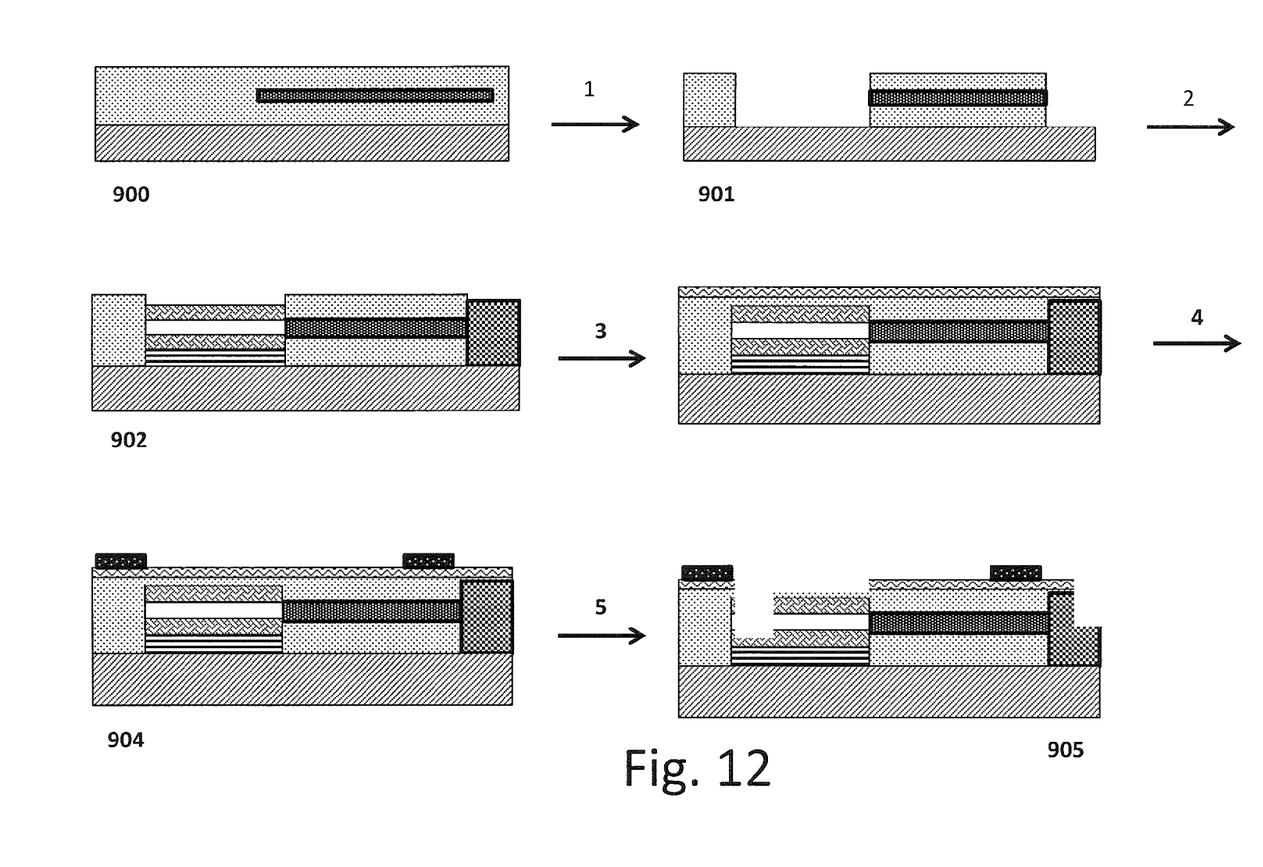
FIG. 12 is a flow diagram of a method for making the semiconductor devices.

FIG. 12 is a block diagram of a method for making the semiconductor devices. In the shown embodiment of the method the starting material (900) is a $SiO_2$ layer containing a SiN waveguide, where the $SiO_2$ layer is deposed on a sapphire substrate. The starting material (900) is shown in greater detail in FIG. 2.

In block 1, two regions of the starting material are recessed to the depth of the sapphire substrate by etching to form a device having two recessed regions (901). The recessed regions may be form by disposing a mask (not shown) over the substrate and the $SiO_2$ layer, where the mask leaves exposed one or both of the regions to be recessed, and then etching the exposed area.

In block 2 the device with two recessed regions is loaded into a growth furnace together with the laser or detector material, such as GaN or InGaN. Windows are opened onto the chip and the laser and detector regions are grown layer by layer. The GaN/InGaN is deposited at approximately 1200° C. to form device (902). Device 902 has laser and detector regions disposed on the sapphire substrate. Device 902 is shown in greater detail in FIG. 3.

In block 3 additional $SiO_2$ is deposited over the device, the device is planarized, for example by chemical mechanical planarization, and a thin Si layer is applied over the device to form a planarized device with a thin Si layer (903). Device 903 is shown in greater detail in FIG. 4.

In block 4 Si CMOS devices are fabricated onto the thin Si layer to form device 904. Device 904 is shown in greater detail in FIG. 5. The Si CMOS devices are fabricated at a lower temperature than the GaN, InGaN, or AlGaN laser and detector structures. The Si CMOS may be fabricated at approximately 1000° C.

In block 5 the device is recessed at the laser and detector regions so that these regions can make contact to the optoelectronic devices, thus forming device 905. Device 905 is shown in greater detail in FIG. 6.

The method may also include deposing an insulating layer over the device to form a device as shown in FIG. 7.

In alternate embodiments the starting material device may be a sapphire substrate only and the regions for the laser and detector may be recessed into the sapphire substrate. A device made by this method is shown in FIGS. 8 and 9.

In another embodiment, the disclosure provides a method of use for the nitride based semiconductor chip on sapphire substrate in which the laser and detector are coupled to a diffractive radiator instead of a fiber. The diffractive radiator may be a vertical grating coupler or a phase array formed of a matrix of grating couplers with individual amplitude and/or phase control on each grating coupler.

This disclosure provides a semiconductor device that allows the integration of nitride based optoelectronic and electronic devices with silicon CMOS. In one embodiment, nitride based optoelectronics can serve as optical interconnects and are buried under the Si CMOS without sacrifice the chip area. In another embodiment, nitride based LED and photodetectors can form ultra-compact monolithic fluorescence sensor for bio-medical applications.

In another embodiment, the disclosure provides a method of use for the nitride based semiconductor chip on sapphire substrate in which the laser and detector are coupled to a fiber via an inverse taper. The inverse taper is used as a spot-size convertor.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a sapphire substrate;
   a laser region and a detector region on the substrate;
   a waveguide between the laser region and the detector region; the laser region, detector region, and waveguide being present in a $SiO_2$ layer, the $SiO_2$ layer being on the sapphire substrate;
   a thin Si layer on the $SiO_2$ layer; and
   an insulating layer on the thin Si layer, laser region and detector region, wherein
   the laser region comprises InGaN, GaN, and optionally AlGaN.

2. The semiconductor device of claim 1, wherein the detector region comprises InGaN.

3. The semiconductor device of claim 1, wherein the waveguide comprises SiN or SiON.

4. The semiconductor device of claim 1, wherein the laser region comprises a buffer on the sapphire substrate, a first cladding layer comprising GaN or AlGaN, a quantum well comprising InGaN, and a second cladding layer comprising GaN or AlGaN.

5. The semiconductor device of claim 1, wherein the laser region has a width of approximately 200 micrometers and a thickness of approximately 2 micrometers; and the detector region has a width of approximately 50 micrometers and a thickness of approximately 2 micrometers.

6. The semiconductor device of claim 1, additionally comprising Si CMOS with optical interconnector on the thin Si layer.

7. A method for making a semiconductor device comprising:
   disposing a laser region onto a sapphire substrate, wherein the laser region is formed by:
   disposing a buffer layer onto the sapphire substrate;
   disposing a first cladding layer comprising GaN, AlGaN, or both onto the buffer layer;
   disposing a layer comprising a InGaN quantum well on the first cladding layer;
   disposing a second cladding layer onto the layer comprising the InGaN quantum well; and
   disposing a detector region onto the sapphire substrate, the semiconductor device including a waveguide interposed between the laser region and the detector region;
   disposing $SiO_2$ over the device including over the laser region, the detector region, and the waveguide;
   planarizing the device to form a planarized device; and
   applying a thin Si layer over the planarized device.

8. The method of claim 7, wherein the detector comprises InGaN.

9. The method of claim 7, comprising
   disposing one or more Si CMOS devices onto the thin Si Layer;
   etching the device to expose the laser region and detector region; and
   disposing an insulating layer over the device.

10. The semiconductor device of claim 1, wherein the laser and detector regions are each coupled to an optical fiber.

11. The semiconductor device of claim 1, wherein the laser and detector regions are each coupled to a diffractive radiator.

* * * * *